(12) United States Patent
Ennis et al.

(10) Patent No.: US 7,279,654 B2
(45) Date of Patent: Oct. 9, 2007

(54) CURRENT SENSOR

(75) Inventors: Michael G. Ennis, Evanston, IL (US);
Thomas J. Tobin, Northbrook, IL (US)

(73) Assignee: S&C Electric Co., Chicago, IL (US)

( * ) Notice: Subject to any disclaimer, the term of this patent is extended or adjusted under 35 U.S.C. 154(b) by 0 days.

(21) Appl. No.: 11/345,934

(22) Filed: Feb. 1, 2006

(65) Prior Publication Data
US 2006/0237444 A1   Oct. 26, 2006

Related U.S. Application Data

(60) Provisional application No. 60/656,260, filed on Feb. 28, 2005.

(51) Int. Cl.
*B23K 10/00*   (2006.01)

(52) U.S. Cl. ............... 219/121.48; 219/121.36; 73/862.325; 324/117 H

(58) Field of Classification Search ............... 219/494, 219/497, 499, 501, 517, 518, 121.48, 121.36; 324/117 H, 546; 73/862.325, 862.322
See application file for complete search history.

(56) References Cited

U.S. PATENT DOCUMENTS

| | | | |
|---|---|---|---|
| 1,958,079 A | * | 5/1934 | Billstein ............... 324/217 |
| 4,286,213 A | * | 8/1981 | Fowler ............... 324/127 |
| 4,717,872 A | * | 1/1988 | Wagner et al. ............... 324/127 |
| 7,086,295 B2 | * | 8/2006 | Izumi ............... 73/862.325 |
| 2005/0030004 A1 | * | 2/2005 | Takatsuka et al. ...... 324/117 H |

* cited by examiner

*Primary Examiner*—Mark Paschall
(74) *Attorney, Agent, or Firm*—James V. Lapacek

(57) ABSTRACT

A current sensor for installation on a conductor without breaking the conductor may include an insulating base having a conductor supporting portion and a conductive coil disposed within an outer surface of the insulating base. A magnetically permeable conductor retaining member includes a portion that passes through the coil and is secured to the insulating base. The retaining member defines a conductor receiving aperture portion with the aperture portion being disposed adjacent the conductor supporting portion of the insulating base. With a conductor positioned within the aperture portion, the conductor is secured by the retaining member to the conductor receiving portion of the insulating base and a substantially continuous permeable path is formed by the conductor retaining member about the conductor.

9 Claims, 2 Drawing Sheets

CURRENT SENSOR

This application claims the benefit of U.S. Provisional Application No. 60/656,260 filed Feb. 28, 2005.

TECHNICAL FIELD

This patent relates to sensors, and more particularly, this patent relates to a current sensor that may be position about a substantially continuous conductor without breaking or severing the conductor.

BACKGROUND

A common current sensor type relies on the principle that an alternating electric current carried within a conductor induces a magnetic flux. The magnetic flux may then be used to induce a current in a conductive coil. The induced current is proportional to the current flowing in the conductor. A magnetically permeable core used in such sensors enhances the properties of the sensor by focusing the magnetic flux relative to the conductive coil. Measurement of the electric current flowing in the coil therefore provides a measure of the electric current flowing in the conductor. The coil may further form a primary coil of a current transformer, and therefore provide a power supply to electronics associated with the sensor making the device a standalone, self-powered device. This relatively simple principle, however, finds difficulty in implementation.

One difficulty is that to take full advantage of the magnetic flux it is best that the permeable path encircle the conductor. Should the permeable path not encircle the conductor, the sensor is more susceptible to interference from other magnetic sources. However, to accomplish this, the conductor has to be made to pass through the permeable core, typically formed as a toroid. For long, high-voltage transmission lines as are commonly used in the electrical power distribution field, this means undesirably breaking or severing of the conductor so that the core may be positioned at the desired location. Feeding the conductor through the core during installation of the line is impractical as it may require feeding literally miles of conductor through the coil, and this option is not available where the sensor is to be installed on an existing installation.

Positioning a permeable core adjacent to the conductor, but not through the core still results in the development of a magnetic flux about the core and a current in a coil encircling the core. One proposal in this regard is to provide a coil in a line post/insulator adjacent to a conductor support portion of the insulator. As noted above, this design is less effective than if the core were made to encircle the conductor and it results in the sensor being substantially more susceptible to noise and interference.

DETAILED DESCRIPTION

A current sensor for installation on a conductor without breaking the conductor may include an insulating base having a conductor supporting portion and a conductive coil disposed within an outer surface of the insulating base. A permeable conductor retaining member includes a portion that passes through the coil and is secured to the insulating base. The retaining member defines a conductor receiving aperture portion with the aperture portion being disposed adjacent to the conductor supporting portion of the insulating base. With a conductor positioned within the aperture portion, the conductor is secured by the retaining member to the conductor receiving portion of the insulating base and a substantially continuous permeable path is formed by the conductor retaining member about the conductor.

In one embodiment described herein, the retaining member is a permeable, substantially U shaped member or yoke having a first leg, a second leg and a base. The first leg and the second leg contact a permeable core disposed within the insulating base, where the permeable core passes through the coil and has a first side portion and a second side portion exposed at an outer surface of the insulating base. In this manner, the first leg of the U shaped member engages the first side portion and the second leg of the U shaped member engages the second side portion to form the substantially continuous permeable path about the conductor.

In another embodiment described herein, the retaining member is a permeable strap. The insulating base is formed to include an aperture for receiving the permeable strap such that the strap engages the insulating base. The strap then encircles a conductor positioned on the conductor support portion securing the conductor to the insulating base and forming a substantially continuous permeable path around the conduct and through the coil. For example, a first end and a second end of the strap may overlappingly engage to form the aperture portion and the permeable path. Furthermore, the strap may include one substantially continuous loop and another loop wherein the first and second ends overlap. The strap may be steel, stainless steel in strand, braided strand, flat stock or other suitable forms. As necessary, the strap may include an insulating and environmentally protective coating.

One or more clamp members and/or buffer material may be disposed between the retaining member and the conductor to secure the conductor to the insulating base and to allow for stress reduction, respectively.

Figure 1:
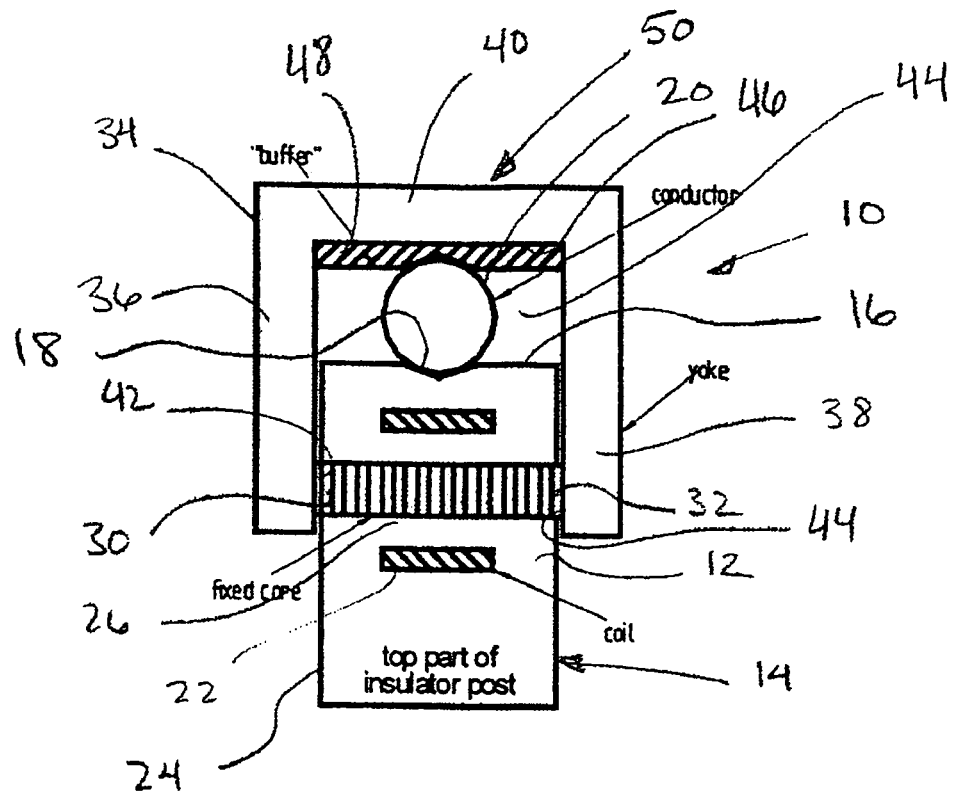
FIG. 1 is a schematic diagram of one of the herein described embodiments of a current sensor.

Referring to FIG. 1, a current sensor 10 is formed to a top portion 12 of an insulating base 14. Insulating bases for installation of high-voltage electrical transmission lines are very well known. In this instance, the insulating base 14 may be formed of any suitable insulating material including ceramics, cured epoxy resin, and the like. For example, the insulating base may be formed of a cured cycloaliphatic epoxy resin such as that commercially available from S and C Electric Company of Chicago, Ill. under the name Cypoxy®. The top portion 12 is formed to include a conductor supporting portion 16, which may be simply the top surface of the insulating base 14, the top surface formed to include a groove 18 (as shown in FIG. 1) are any suitable configuration of the top portion 12 to facilitate supporting a conductor, such as conductor 20.

A conductive coil 22 is disposed within and retained within an outer surface 24 of the insulating base 14. The conductive coil 22 is toroidal with a center 26 and the coil 22 encircles a permeable core 28 with the permeable core 28 substantially at the center 26. The permeable core 28 includes a first side portion 30 and a second side portion 32, each of which extend outwardly from the outer surface 24 and are not contained within the insulating base 14.

A conductor retainer member or yoke 34 is secured to the insulating base 14, such as by threaded fasteners (not depicted) received through apertures (not depicted) formed in the yoke 24 and engaging threaded apertures in the insulating base 14, clamps, straps, adhesive or any suitable means for retaining the yoke 34 to the insulating base 14 as would be well within the skill of one having ordinary skill in the art to specify. The yoke 34 has a generally U shaped configuration with a first leg 36, a second leg 38 and a base 40. The first leg 36 includes a first surface portion 40 and the second leg 38 includes a second surface portion 42. The yoke 34 defines an aperture portion 44 within which the conductor 20 is received. Yoke surface 46 engages the conductor 20 for retaining the conductor 20 on the conductor supporting portion 16.

The permeable core 30 and the yoke 34 each are made of a permeable material, such as a ferromagnetic material including iron, iron alloys, nickel alloys and the like. For example, the yoke 34 may be iron with a nickel alloy plating covering its outer surface. Similarly, if the permeable core is made of iron, the first portion 30 and the second surface portion 32 may be nickel plated. With the yoke 34 engaged with the insulating base 14, the yoke first surface 40 engages the core first portion 30 and the yoke second surface 42 engages the core second portion 32 thereby forming a substantially continuous permeable loop 50 around the conductor 20. In operation, loop 50 couples the magnetic flux resulting from the changing electric current in the conductor 20 with the conductive loop 24 inducing a current in the loop 24. The loop 24 may form the first or primary winding of a current transformer or other circuit from which the current within the loop 24 may be measured. The current within the loop 24 will be proportional to the current in the conductor 20, and hence, the current within the conductor 20 may be inferred and measured.

The insulating base 14 may have a circular, elliptical, rectangular or any suitable cross-sectional configuration. It may further include scalloped side surfaces (sheds), as is well known in the art. The yoke 34 will likewise have a corresponding semi-circular, semi-elliptical, rectangular or suitable shape to engage the insulating base 14 such that the substantially continuous permeable path is formed. Should the insulating base 14 include sheds, those in the areas of the first portion 30 and the second portion 32 may be removed to aid the positioning of the yoke 34 to the insulating base 14 and engagement of the first portion 30 with the first surface 40 and the second portion 32 with the second surface 42.

Figure 2:
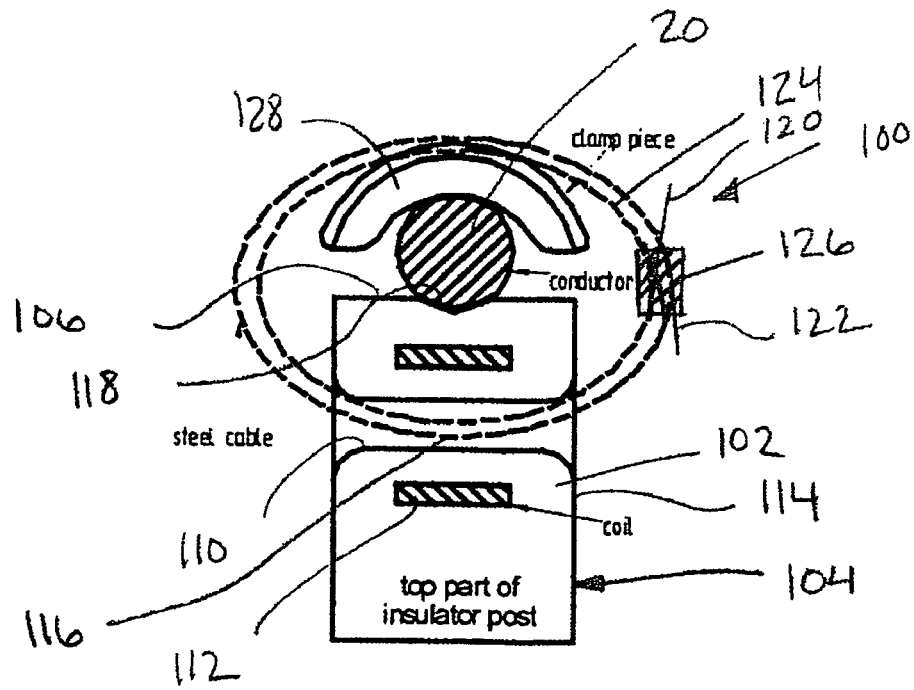
FIG. 2 is a schematic diagram of another of the herein described embodiments of a current sensor.

Another embodiment of a current sensor is described with reference to FIG. 2, wherein a current sensor 100 is formed to a top portion 102 of an insulating base 104. Insulating bases for installation of high-voltage electrical transmission lines are very well known. In this instance, the insulating base 104 may be formed of any suitable insulating material including ceramics, cured epoxy resin, and the like. For example, the insulating base 104 may be formed of a cured cycloaliphatic epoxy resin such as that commercially available from S&C Electric Company of Chicago, Ill. under the name Cypoxy®. The top portion 102 is formed to include a conductor supporting portion 106, which may be simply the top surface of the insulating base 104, the top surface formed to include a groove 108 (as shown in FIG. 2) or any suitable configuration of the top portion 12 to facilitate supporting a conductor, such as conductor 20.

The insulating base 104 is formed to include an aperture 110 that extends through the insulating base 104 creating a passage there through. The aperture 110 may be chamfered at each opening to facilitate assembly of the conductor retaining member, described below. A conductive coil 112 is disposed within and retained within an outer surface 114 of the insulating base 104. The conductive coil 112 is toroidal having a center 116, and the coil 112 encircles the aperture 110 with the aperture 110 being substantially at the center 116.

A conductor retainer member 118 in this embodiment is a permeable strap that is received through the aperture 110 and has a first end 120 and a second 122. The first strap is formed into at least one substantially continuous loop 124, although more than one substantially continuous loop may be formed. The first end 120 and the second end 122 then overlappingly engage and are secured by a clamp 126 or other suitable means. For example, the clamp 126 may be a crimp-type clamp made of a deformable material. The retaining member 118 is made of a permeable material. For example, the retaining member 118 may be a steel strand, braided steel strands, steel flat stock and the like. Furthermore, the retaining member 118 may be coated to provide electrical insulation and corrosion protection.

In practice, the first end 120 and the second end 122 are drawn in tension to secure the conductor 20 to the conductor support portion 106. The ends 120 and 122 are then overlappingly engaged and clamped by the clamp 126 to retain maintain tension in the strap, and hence, to provide a clamping force securing the conductor 20 to the insulating base 104. A semi-arcuate clamping member 128 is optionally provided to distribute the clamping force on the conductor 20. A buffer material 130 is further optionally provided between the clamping member 128 and the conductor 20 to relieve dielectric stress.

Therefore, the conductor retaining member 112 with the loop 124 forms a substantially continuous permeable path around the conductor 20. In operation, loop 124 couples the magnetic flux resulting from the changing electric current in the conductor 20 with the conductive loop 112 inducing a current in the loop 112. The loop 112 may form the first or primary winding of a current transformer or other circuit from which the current within the loop 24 may be measured. The current within the loop 112 will be proportional to the current in the conductor 20, and hence, the current within the conductor 20 may be inferred and measured.

The insulating base 14 may have a circular, elliptical, rectangular or any suitable cross-sectional configuration. It may further include scalloped side surfaces, as is well known in the art.

Figure 3:
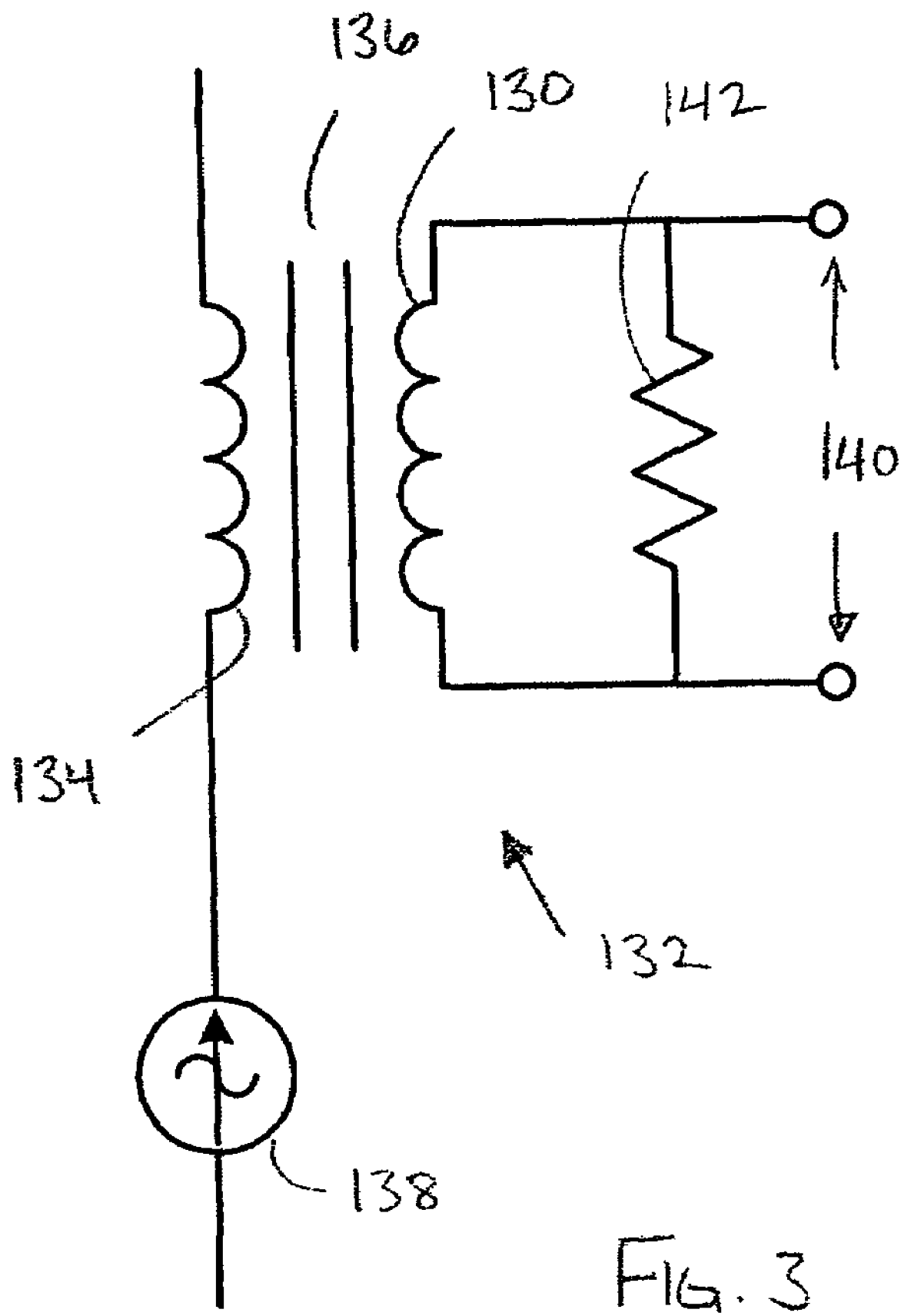
FIG. 3 is a circuit diagram of circuit that may be used in conjunction with the herein described current sensors.

FIG. 3 illustrates a circuit in which either of coil 24 or coil 112 forms the secondary winding 130 of a current transformer 132. The current conductor, e.g., conductor 20, for which current is to be measured forms the primary winding 134, and the yoke 34/magnetically permeable core 30 or loop 124 formed by the conductor retaining member 118, respectively, for the current sensors 10 and 100, form the permeable core 136 coupling the primary winding 134 and the secondary winding 130. The output current of the current transformer 132 is proportional to the current 138 in the conductor. The voltage 140 developed across the secondary burden, illustrated as load 142 in FIG. 3, and other wiring characteristics determine the core saturation characteristics.

The invention has been described in terms of several embodiments, including a number of features and functions. Not all features and functions are required for every embodiment of the invention, and in this manner the invention provides a flexible, easily installed without breaking the conductor current sensor that has better noise immunity. The features discussed herein are intended to be illustrative of those features that may be implemented; however, such features should not be considered exhaustive of all possible features that may be implemented in a device configured in accordance with the embodiments of the invention. Moreover, the herein described embodiments are illustrative, not limiting of the invention. The invention is defined and limited only by the following claims.

We claim:

1. A current sensor for installation on a conductor without breaking the conductor, the current sensor comprising:
   an insulating base having a conductor supporting portion and a conductive coil disposed within an outer surface of the insulating base,
   a magnetically permeable conductor retaining member, the retaining member being secured to the insulating base, passing through the coil and having a conductor receiving aperture portion, the aperture portion being disposed adjacent the conductor supporting portion of the insulating base, the conductor retaining member thereby being such that with a conductor positioned within the aperture portion, the conductor is secured by the retaining member to the conductor receiving portion of the insulating base and a substantially continuous permeable path is formed by the conductor retaining member about the conductor, the retaining member comprising a permeable strap, the insulating base formed to include an aperture for receiving the permeable strap and engaging the strap with the insulating base, the permeable strap having a first end and a second end, the first end and the second end overlappingly engaged to form a substantially continuous loop.

2. The current sensor of claim 1 comprising a clamp member engaging the retaining member and with a conductor positioned within the aperture portion, the clamp member is disposed within the aperture portion such that the clamp member is between the conductor and the retaining member.

3. The current sensor of claim 1, a buffer material engaging the retaining member and with a conductor positioned within the aperture portion, the buffer material is disposed within the aperture portion such that the buffer material is between the conductor and the retaining member.

4. A current sensor for installation to a conductor for sensing an electric current carried by the conductor:
   an insulating base, the insulating base including a conductor supporting potion, an aperture and a coil disposed within the base and encircling the aperture;
   a permeable strap having a first end and a second end, the strap extending through the aperture, the first end and the second end overlapping to form a substantially continuous permeable path adjacent the conductor supporting portion of the insulating base.

5. The current sensor of claim 4, the permeable strap comprising braided steel cable.

6. The current sensor of claim 4, the braided steel cable having an insulating coating on an exterior surface thereof.

7. The current sensor of claim 4, the permeable strap comprising a flat permeable material.

8. The current sensor of claim 4, the first and the second end overlappingly engaged to form an aperture.

9. The current sensor of claim 4, the first end and the second end overlappingly engaged to form a substantially continuous loop.

* * * * *